United States Patent [19]
Huang

[11] Patent Number: 5,481,208
[45] Date of Patent: Jan. 2, 1996

[54] PIECEWISELY-CONTROLLED TRI-STATE OUTPUT BUFFER

[75] Inventor: Yen-Tsai Huang, Chung-Li, Taiwan

[73] Assignee: United Microelectronics Corp., Hsinchu, Taiwan

[21] Appl. No.: 144,576

[22] Filed: Oct. 28, 1993

[51] Int. Cl.[6] ................................. H03K 19/02
[52] U.S. Cl. .................... 326/87; 326/27; 326/58
[58] Field of Search ................... 307/443, 451, 307/263; 326/87, 58, 27, 121

[56] References Cited

U.S. PATENT DOCUMENTS

| | | | |
|---|---|---|---|
| 4,731,553 | 3/1988 | Van Lehn | 307/451 |
| 5,121,013 | 6/1992 | Chuang | 307/263 |
| 5,122,690 | 6/1992 | Bianchi | 307/263 |
| 5,306,965 | 4/1994 | Asprey | 307/443 |
| 5,332,932 | 7/1994 | Runaldue | 307/443 |

Primary Examiner—Edward P. Westin
Assistant Examiner—Andrew Sanders
Attorney, Agent, or Firm—Ladas & Parry

[57] ABSTRACT

A piecewisely-controlled tri-state output buffer has a signal buffer portion, an output falling-edge detector capable of generating a falling-edge control signal, an output rising-edge detector capable of generating a rising-edge control signal, and a signal output portion. The signal output portion includes one pair of PMOS transistors connected in parallel and one pair of NMOS transistors connected in parallel. One of the pair of PMOS transistors has a structural width larger than that of another PMOS transistor, and one of the pair of NMOS transistors has a structural width larger than that of another NMOS transistor. The gate of the one PMOS transistor is controlled by the rising-edge control signal while the gate of the one NMOS transistor is controlled by the falling-edge control signal.

3 Claims, 5 Drawing Sheets

PIECEWISELY-CONTROLLED TRI-STATE OUTPUT BUFFER

BACKGROUND OF THE INVENTION

The present invention relates generally to a piecewisely-controlled tri-state output buffer, and more particularly to a piecewisely-controlled tri-state output buffer with at least two PMOS (P-channel Metal-Oxide Semiconductor) and at least two NMOS (N-channel Metal-Oxide Semiconductor) transistors, which has the advantages of high speed and low output current.

At present, typical electronic logic devices which are commonly used to implement digital electronic circuits include bipolar TTL (Transistor-Transistor Logic) and CMOS (Complementary Metal-Oxide Semiconductor) ICs (Integrated Circuits). In comparison, these two kinds of commonly-used basic logic devices have different characteristics. For example, TTL devices have relatively short signal delay times, and thus have higher processing speed. On the other hand, CMOS devices have longer signal delay times, and thus have lower processing speed, but CMOS devices also have lower power consumption requirement and tolerate a wider power-supply voltage range than do TTL devices. Basically, the power-supply voltage range of CMOS devices may be from about 3V up to 20V DC. If the processing speed is not very important, a lower operating voltage can be used to reduce power consumption. If high processing speed is required, the operating voltage must be increased. In the latter case, power consumption will also be increased.

The power-supply voltage range of TTL devices is relatively narrow, e.g. from about 4.5V to 7V DC. However, the processing speed of TTL devices is far faster than that of CMOS devices, although the power consumption of TTL devices is far higher. Futhermore, the fan-out capability of TTL devices is better than that of CMOS devices, i.e. a single output of a TTL device can drive more inputs than can a single output of a CMOS device.

Due to the limitations of basic physical properties, TTL and CMOS devices inherently have opposite advantages and drawbacks. The choices of power consumption, processing speed, and fan-out capability depend on application requirements, but as a general case, higher speed, lower power consumption, and larger fan-out capability are preferred. In order to achieve optimal integrated circuits, many approaches have been proposed in this art to decrease the power consumption of TTL devices, or to enhance the speed and fan-out capability of CMOS devices.

According to CMOS technology, if a CMOS IC is intended to reach the same speed performance as the F series of TTL devices, large-sized MOS transistors must be used. This will however result in relatively large output current, and thus relatively high power consumption. Therefore, if an output buffer only utilizes a pair of PMOS and NMOS transistors, it is hard to obtain high speed, and to keep the low output current characteristic of CMOS devices.

SUMMARY OF THE INVENTION

The primary object of the present invention is to provide a piecewisely-controlled tri-state output buffer with low output current, low power consumption, and high speed characteristics.

Another object of the present invention is to provide a piecewisely-controlled tri-state output buffer which utilizes two pairs of PMOS and NMOS transistors as output drivers. The PMOS and NMOS transistors have different sizes, and are activated at different times to achieve optimal characteristics, including high speed, low current at high-level signal output, high current at low-level signal output, and a small ground bounce at the output terminal.

Yet another object of the present invention is to provide a piecewisely-controlled tri-state output buffer which has a relatively short signal delay characteristic, so that its entire signal processing speed is enhanced.

In accordance with the present invention, a piecewisely-controlled tri-state output buffer comprises a signal buffer portion, an output falling-edge detector capable of generating a falling-edge control signal at its output terminal, an output rising-edge detector capable of generating a rising-edge control signal at its output terminal, and a signal output portion; and the piecewisely-controlled tri-state output buffer is characterized in that:

the signal output portion includes one pair of PMOS transistors connected together in parallel and one pair of NMOS transistors connected together in parallel, one of the pair of PMOS transistors having a structural width larger than that of another PMOS transistor, one of the pair of NMOS transistors having a structural width larger than that of another NMOS transistor, and the gate electrode of said one PMOS transistor being connected to the output terminal of the output rising-edge detector to be controlled by the rising-edge control signal while the gate electrode of said one NMOS transistor being connected to the output terminal of the output falling-edge detector to be controlled by the falling-edge control signal.

In accordance with one aspect of the present invention, the output rising-edge detector includes a delay line constituted by an inverter at its output terminal, and the output falling-edge detector also includes a delay line constituted by an inverter at its output terminal.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 1:
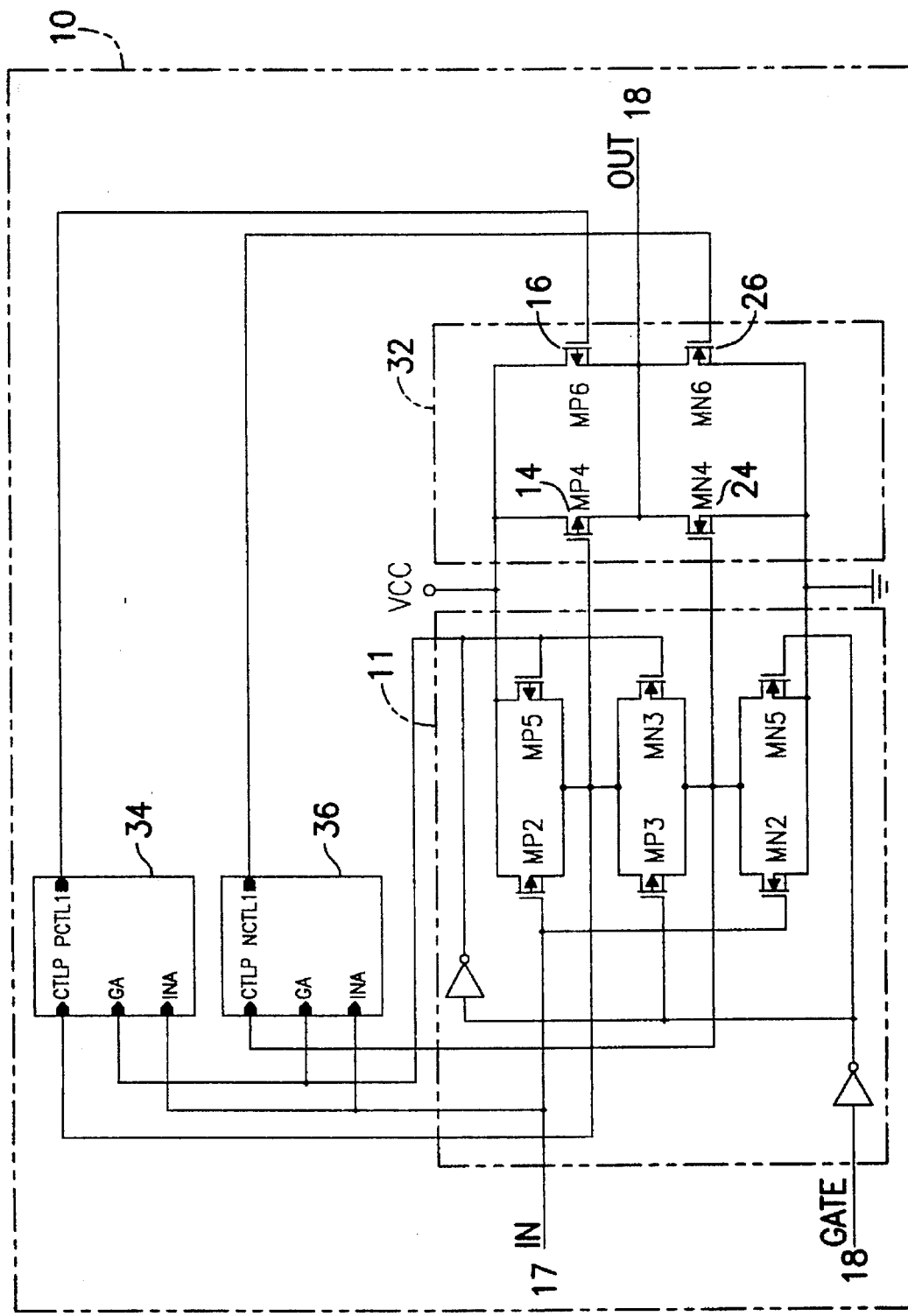
FIG. 1 is an electrical circuit schematic diagram of a piecewisely-controlled tri-state output buffer according to one preferred embodiment of the present invention.

Referring now to FIG. 1, there is shown an electrical circuit diagram of a piecewisely-controlled tri-state output buffer 10 according to a preferred embodiment of the present invention. The piecewisely-controlled tri-state output buffer 10 comprises a signal buffer portion 11, a signal output portion 32, an output falling-edge detector 36, and an output rising-edge detector 34. An input signal IN to be buffered is input at an input terminal 17. A gate-control input signal GATE is input at another input terminal 19, and is utilized to determine whether the output of the buffer 10 is the buffered input signal IN or at a floating state. The buffered output signal OUT is provided at an output terminal 18.

The signal output portion 32 of the piecewisely-controlled tri-state output buffer 10 includes one pair of PMOS transistors 14 and 16 connected together in parallel, and one pair of parallel-connected NMOS transistors 24 and 26 connected together in parallel also. In the pair of PMOS transistors, the structural width of the transistor 16 is larger than that of the transistor 14. In this embodiment, the width/length of transistor 16 may be 1000.0/2.0 while the width/length of transistor 14 is 450.0/2.0 (micron). In the pair of NMOS transistors, the structural width of the transistor 26 is larger than that of the transistor 24. In this embodiment, the width/length of transistor 26 may be 800.0/2.0 while the width/length of transistor 24 is 200.0/2.0 (micron).

The control signal PCTL1 of the output rising-edge detector 34 in the piecewisely-controlled tri-state output buffer 10 is connected to the gate electrode of PMOS transistor 16. The control signal NCTL1 of the output falling-edge detector 36 in the piecewisely-controlled tri-state output buffer 10 is connected to the gate electrode of NMOS transistor 26. The output rising-edge detector 34 generates a one-shot pulse at its output to turn on the PMOS transistor 16 at the time when the rising-edge detector 34 detects that the input signal of the piecewisely-controlled tri-state output buffer 10 is at its rising edge. The output falling-edge detector 36 generates a one-shot pulse at its output to turn on the NMOS transistor 26 at the time when the falling-edge detector 36 detects that the input signal of the piecewisely-controlled tri-state output buffer 10 is at its falling edge. In this way, transistor 26 will turn on later than will transistor 16.

When the output signal of the piecewisely-controlled tri-state output buffer 10 is at its rising edge, the PMOS transistors 14 and 16 are turned on simultaneously. Such an operation is equivalent to the turn-on operation of a PMOS transistor having a structural width equal to the sum of the structural widths of the transistors 14 and 16. Since the combined width is sufficiently large, the voltage level of the output signal of the buffer 10 is rapidly pulled up to the power-source voltage level Vcc, so that a high processing speed for the output signal is obtained. When the voltage level of the output signal is pulled to its high-level, the PMOS transistor 16 is then turned off while the PMOS transistor 14 stays active, so that the output current of the output signal is decreased to the level of that provided by PMOS transistor 14 alone. The structural widths of the PMOS transistors 14 and 16 can be varied, and the conductive time period of transistor 16 can be adjusted, so that the rise time of the output signal is shortened, and the high-level output current is decreased, optimally.

When the voltage level of the output signal of the piecewisely-controlled tri-state output buffer 10 changes from HIGH to LOW, the ground bouncing problem must be taken into consideration. It is also important that the output current cannot be too small when the voltage level of the output signal has changed from HIGH state to LOW state. In order to achieve these objects, when the level of the output signal changes from HIGH to LOW, NMOS transistor 24 is turned on first. After the level of the output signal reaches a stable low-level state, NMOS transistor 26 is also turned on. At this time, the sum of the structural widths of the transistors 24 and 26 increase the low-level output current capability of the output signal.

Figure 2:
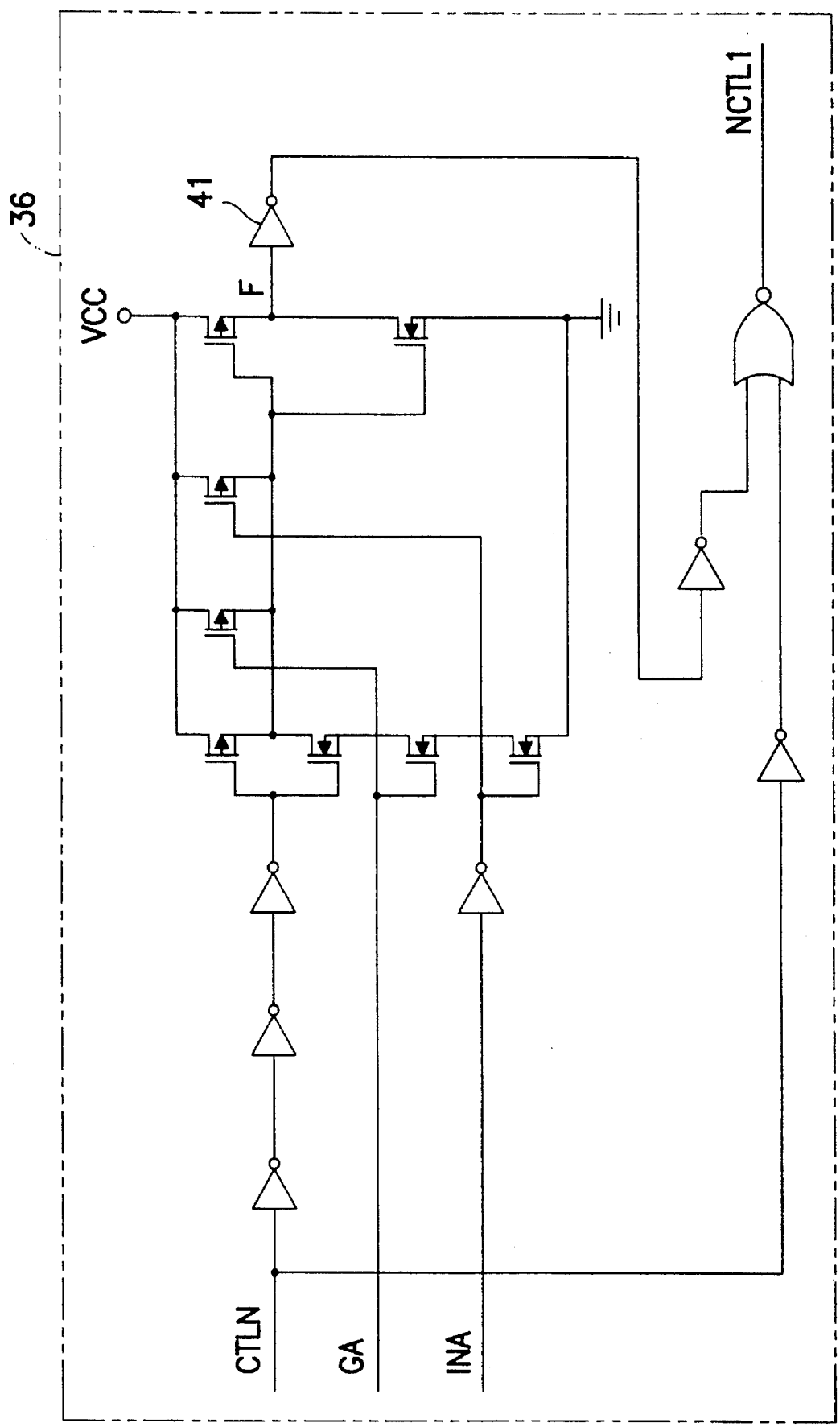
FIG. 2 is an electrical circuit schematic diagram of an output falling-edge detector used in the piecewisely-controlled tri-state output buffer shown in FIG. 1.

The switching of NMOS transistor 26 is controlled by the output signal NCTL1 of the output falling-edge detector 36. With reference to FIG. 2, there is shown a preferred electrical circuit embodiment of the output falling-edge detector 36 which can be used in the piecewisely-controlled tri-state output buffer 10 of the present invention. The output falling-edge detector 36 receives three signals, CTLN, GA, and INA from the output buffer 10 to generate control signal NCTL1 for transistor 26. The output falling-edge detector 36 is provided with a delay line, e.g. an inverter 41, at its pulse signal output terminal F. The delay line 41 is used to delay the generation of the control signal NCTL1 when the output falling-edge detector 36 detects the falling edge of the input signal IN, so that the control signal NCTL1 is delayed to turn on NMOS transistor 26 at the time closely when the output signal of the output buffer 10 is at its falling edge. If necessary, several additional stages of delay inverters can be further provided and connected in series in order to supply several additional pulse signals having different delay times. In such a case, several additional NMOS transistors are further connected in parallel with transistors 24 and 26, and are controlled by the additional output pulse signals of the output falling-edge detector 36. In this way, the current of the low-level output signal of the output buffer 10 can be adjusted, as desired to meet different requirements in a series of steps. The delay lines or inverters following CTLN are used to control the width of the pulse signal at the node F, as shown in FIG. 2.

Figure 3:
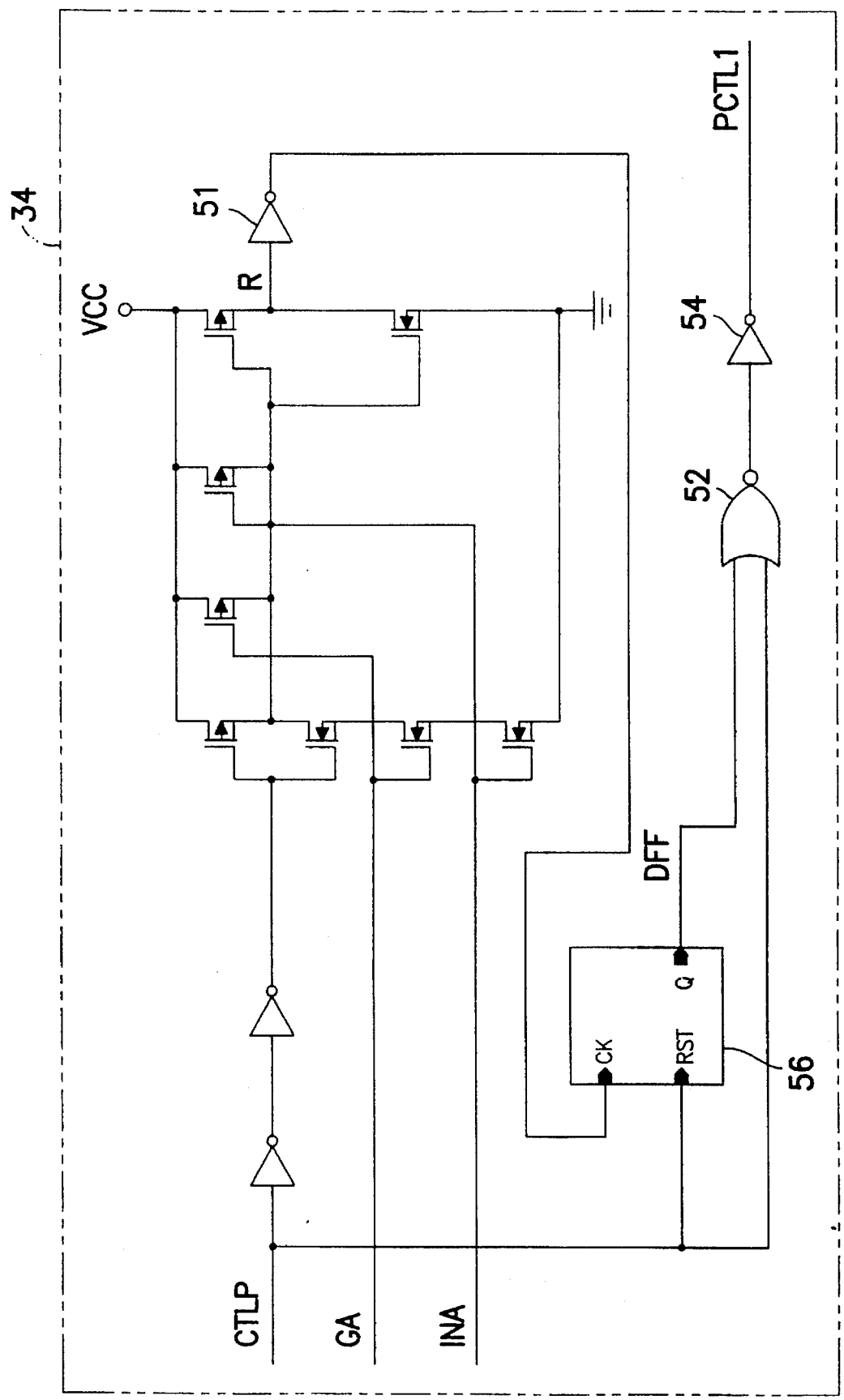
FIG. 3 is an electrical circuit schematic diagram of an output rising-edge detector used in the piecewisely-controlled tri-state output buffer shown in FIG. 1.

Similarly, the switching of the PMOS transistor 16 is controlled by the output signal PCTL1 of the output rising-edge detector 34. With reference to FIG. 3, there is shown a preferred electrical circuit embodiment of the output rising-edge detector 34 which can be used in the piecewisely-controlled tri-state output buffer 10 of the present invention. The output rising-edge detector 34 receives three signals, CTLP, GA, and INA from the output buffer 10 to generate control signal PCTL1 for transistor 16. The output rising-edge detector 34 is provided with a delay line, e.g. an inverter 51, at its pulse signal output terminal R. The delay line 51 is used to delay the generation of the control signal PCTL1 when the output rising-edge detector 36 detects the rising edge of the input signal IN, so that the control signal PCTL1 is delayed to turn off PMOS transistor 16 at the time closely when the output signal of the output buffer 10 is at its rising edge. If necessary, several additional stages of delay inverters can be further provided and connected in series in order to supply several additional pulse signals having different delay times. In such a case, several additional PMOS transistors are further connected in parallel with transistors 14 and 16, and are controlled by the additional output pulse signals of the output rising-edge detector 34. In this way, the current of the high-level output signal of the output buffer 10 can be adjusted, as desired to meet different requirements in a series of steps. The delay lines or inverters following CTLP are used to control the width of the pulse signal at the node R, as shown in FIG. 3.

Figure 4:
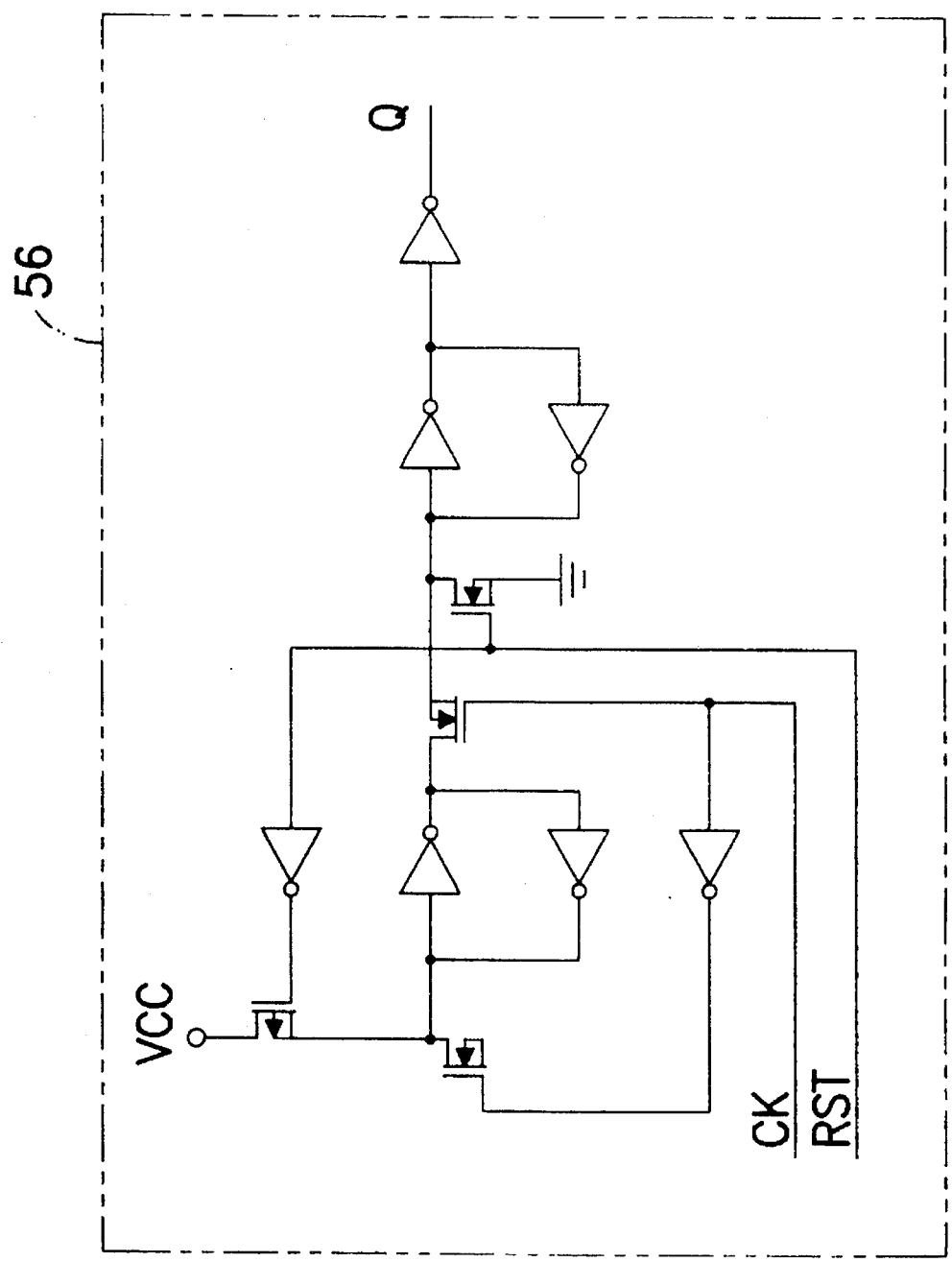
FIG. 4 is an electrical circuit schematic diagram of a D-type flip-flop which is utilized to control the conductive time period of the transistor MP6 shown in FIG. 1.

The pulse signal of the output rising-edge detector 34 shown in FIG. 3 is sent to a D-type flip-flop 56 before passing through a NOR gate 52 and an inverter 54. The D-type flip-flop 56 is utilized to control the conductive time period of the PMOS transistor 16. FIG. 4 shows one electrical circuit embodiment of the D-type flip-flop 56.

Figure 5:
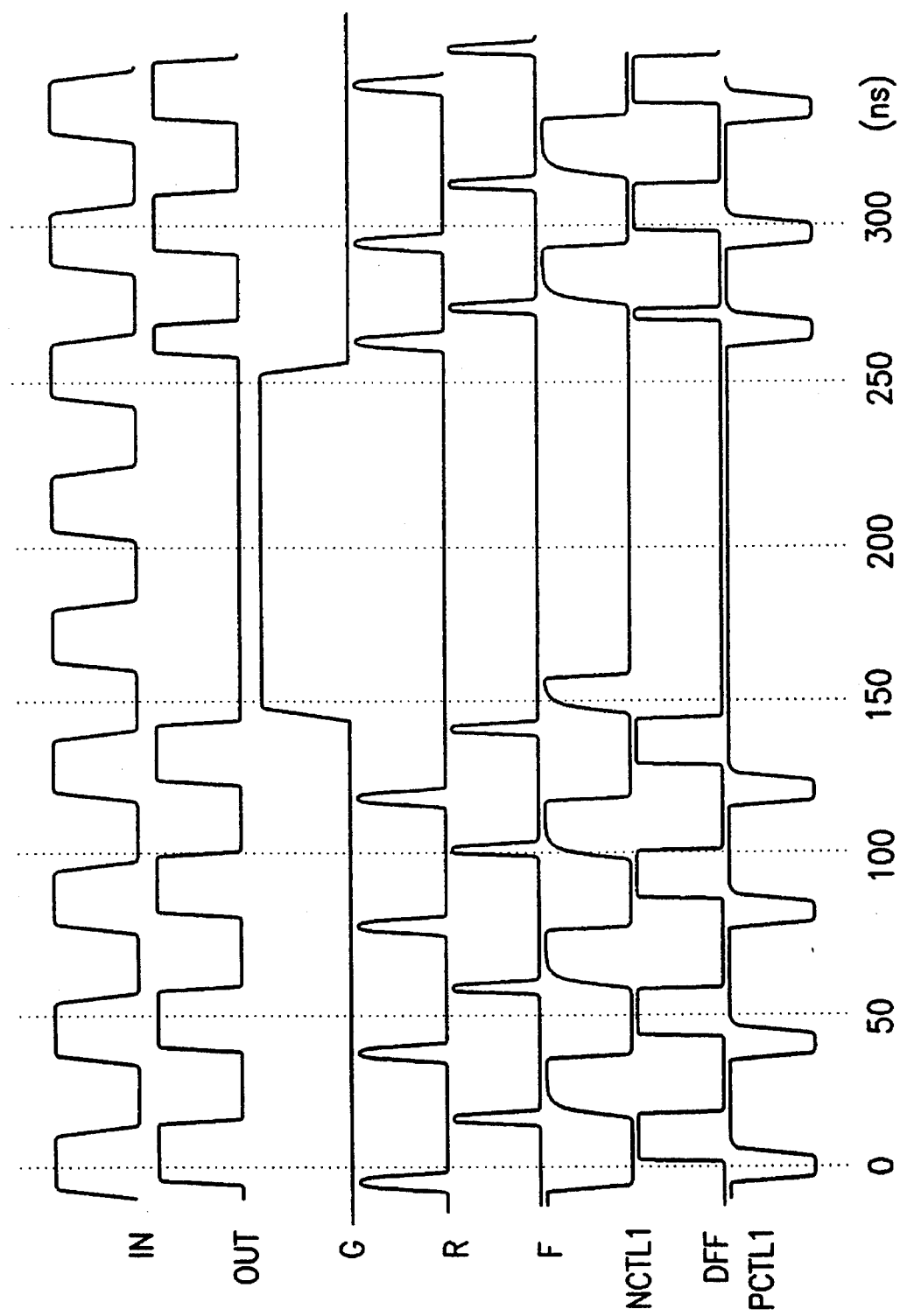
FIG. 5 is a timing diagram of several signals present in the piecewisely-controlled tri-state output buffer shown in FIG. 1.

Referring to FIG. 5, there is shown a timing diagram of the IN, OUT, G, R, F, NCTL1, DFF, and PCTL1 signals present in the piecewisely-controlled tri-state output buffer 10. The IN signal represents the input signal to be buffered at the input terminal 17 of FIG. 1. The OUT signal represents the output signal at the output terminal 18 of FIG. 1. The G signal represents an input signal GATE at the input terminal 19 of FIG. 1. The NCTL1 signal represents the control signal which controls the gate electrode of NMOS transistor 26, as is shown in FIG. 1 and 2. The PCTL1 signal represents the control signal which controls the gate electrode of PMOS transistor 16, as is shown in FIG. 1 and 3. The R signal represents the pulse signal generated at the input of the delay line inverter 51 of the output rising-edge detector 34 as shown in FIG. 3. The F signal represents the pulse signal generated at the input of the delay line inverter 41 of the output falling-edge detector 36 as shown in FIG. 2. The DFF signal represents the output signal Q of the D-type flip-flop 56 as shown in FIG. 3 and 4.

As can be clearly seen in FIG. 5, control signal PCTL1 for the gate of PMOS transistor 16 changes to a LOW level on the rising edge of output signal OUT. At this time, the PMOS transistor 16 is turned on to accelerate the rising speed of the output signal OUT to a HIGH level. Then, the control signal PCTL1 returns to a HIGH level to turn off PMOS transistor 16. At this time, only PMOS transistor 14, which has a smaller structural width, is still active. In this way, not only is the current of the high-level output signal decreased, but also the current variation at the falling edge of the output signal will be decreased to lower the ground bounce at the output terminal.

As also can be clearly seen in FIG. 5, the control signal NCTL1 for the gate of NMOS transistor 26 changes to a HIGH level on the falling edge of the output signal OUT. At this time, NMOS transistor 26 is turned on to increase the current of the low-level output signal. Since only transistor 24, which has a smaller structural width, is active right at the falling edge of the output signal OUT, the state translation current is decreased to lower the ground bounce at the output terminal.

The preferred embodiment of the piecewisely-controlled tri-state output buffer of the present invention disclosed in FIGS. 1 to 4 has the advantageous characteristics of fast propagation speed, small output current at its high-level, low ground bounce at the output terminal, and large output current at its low-level.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A piecewisely-controlled tri-state output buffer comprising a signal buffer portion, an output falling-edge detector capable of generating a falling edge control signal at its output terminal, an output rising-edge detector capable of generating a rising-edge control signal at its output terminal, and a signal output portion; and said piecewisely-controlled tri-state output buffer being characterized in that:

said output falling-edge detector and said output rising-edge detector each being connected to an input terminal of the piecewisely-controlled tri-state output buffer, said signal output portion includes one pair of PMOS transistors connected together in parallel and one pair of NMOS transistors connected together in parallel, one of said pair of PMOS transistors having a structural width larger than that of another PMOS transistor, one of said pair of NMOS transistors having a structural width larger than that of another NMOS transistor, and the gate electrode of said one PMOS transistor being connected to the output terminal of said output rising-edge detector, the gate electrode of said one of said pair of PMOS transistors to be controlled by said rising-edge control signal generated by said rising-edge detector in response to a rising-edge of an input signal input at said input terminal into the signal buffer portion, while the gate electrode of said one NMOS transistor being connected to the output terminal of said output falling-edge detector, the gate electrode of said one of said pair of NMOS transistors to be controlled by said falling-edge control signal generated by said output falling-edge detector in response to a falling edge of the input signal input at said input terminal into the signal buffer portion.

2. The piecewisely-controlled tri-state output buffer as claimed in claim 1, wherein said output rising-edge detector includes a delay line constituted by an inverter at its output terminal.

3. The piecewisely-controlled tri-state output buffer as claimed in claim 1, wherein said output falling-edge detector includes a delay line constituted by an inverter at its output terminal.

* * * * *